United States Patent [19]

Katakura

[11] Patent Number: 4,462,008

[45] Date of Patent: Jul. 24, 1984

[54] NOISE REDUCTION CIRCUIT HAVING VOLTAGE TO CURRENT CONVERTING MEANS IN THE AUXILIARY CHANNEL

[75] Inventor: Masayuki Katakura, Yokohama, Japan

[73] Assignee: Sony Corporation, Tokyo, Japan

[21] Appl. No.: 451,453

[22] Filed: Dec. 20, 1982

[30] Foreign Application Priority Data

Dec. 29, 1981 [JP] Japan .................. 56-214824
Dec. 29, 1981 [JP] Japan .................. 56-214825

[51] Int. Cl.³ .......................................... H04B 1/64
[52] U.S. Cl. .................................. 333/14; 330/110; 307/542
[58] Field of Search ............... 333/14, 17 L; 330/110, 330/282; 455/72, 63; 331/10; 307/546, 542, 551, 540, 264; 328/168, 169, 171

[56] References Cited

U.S. PATENT DOCUMENTS

| | | | |
|---|---|---|---|
| 3,818,362 | 6/1974 | van Sluys | 330/282 |
| 3,828,280 | 8/1974 | Dolby | 333/14 |
| 3,848,194 | 11/1974 | Nishimura et al. | 330/282 |
| 3,903,485 | 9/1975 | Dolby | 333/14 |
| 3,932,768 | 1/1976 | Takahashi et al. | 307/264 |
| 4,220,875 | 9/1980 | Lawton | 333/14 X |
| 4,412,189 | 10/1983 | Kominami et al. | 333/14 |

*Primary Examiner*—Paul L. Gensler
*Assistant Examiner*—Benny Lee
*Attorney, Agent, or Firm*—Lewis H. Eslinger; Alvin Sinderbrand

[57] ABSTRACT

In a noise reduction circuit comprising a combining circuit which generates a combined signal in response to signals supplied thereto, a main channel which supplies an information signal substantially unchanged to the combining circuit, and an auxiliary channel which receives the information signal and which supplies a modified information signal to the combining circuit for combining with the unchanged information signal, the auxiliary channel includes a high pass filter with a variable cut-off frequency which generates a filtered output signal in response to the information signal supplied thereto, a voltage-current converting circuit which converts the voltage level of the filtered output signal to a current and which supplies the current to the combining circuit, and an amplitude limiting circuit which limits the amplitude of the current supplied to the combining circuit.

20 Claims, 10 Drawing Figures

NOISE REDUCTION CIRCUIT HAVING VOLTAGE TO CURRENT CONVERTING MEANS IN THE AUXILIARY CHANNEL

BACKGROUND OF THE INVENTION

1. Field of the Invention

This invention relates to information signal transmitting apparatuses, and more particularly, to a noise reduction circuit for enlarging the apparent dynamic range of a signal transmission system or a recording and reproducing apparatus by alternately compressing and expanding an information signal.

2. Description of the Prior Art

Noise reduction circuits generally operate by compressing a signal at the time of recording or transmission and by expanding the compressed signal at the time of reception or playback whereby the apparent dynamic range of the recording or transmission medium is expanded. A compression circuit is accordingly provided at the signal input point, and an expansion circuit is provided at the signal output point. The compression and expansion circuits include variable transfer function circuits which adjust the gain of signals supplied thereto. Control circuits are also included to change the transfer function in response to the signal level and the frequency of the signal. Transfer function circuits and control circuits, however, have predetermined response time constants and occasionally exhibit undesirable transfer responses when an input signal supplied thereto changes very suddenly by a large amount.

In a compression circuit, for example, the gain is increased to a very large value when the input signal level is low, and increased to a smaller value when the input signal level is high. When an input signal level increases suddenly, however, a high level signal is applied to a circuit which has a transiently high gain state due to the response time constant, so that an output signal from the circuit has an extremely large magnitude or overshoot. It is to be appreciated that a recording medium has a maximum allowable level, known as a saturation level, so that when an input signal exceeds the maximum allowable level, the output signal from the expansion circuit is not a precise copy or replica of the original input signal. Prior art noise reduction circuits thus include amplitude limiting circuits in the compression circuit so that the signal amplitude is lower than the maximum allowable amount to prevent an overshoot condition.

Amplitude limiting circuits are usually formed of non-linear elements using semi-conductor PN junctions, such as diodes. A diode limiter is shown, for example, in U.S. Pat. No. 3,631,365.

Non-linear elements such as diodes have limited applicability, however, because of their fixed limiter levels. For example, a silicon PN junction has a forward threshold level approximately equal to 0.6 V. An amplitude limiting circuit including a reversed parallel circuit of two silicon diodes (in which the anodes and the cathodes are connected in reverse order) has a limiter level approximately equal to 1.2 $V_{p-p}$ (peak to peak value). The limiter level tends to be considerably larger than the signal level in the neighborhood of a junction in the amplitude limiting circuit. Hence, the limiter level is impractically large when the silicon diode limiter is used unmodified in the compression circuit.

According to the prior art, an amplifier is connected to the input side of the silicon diode limiter and sets an adequate limiter level relative to the signal level in the neighboring circuit portions by preamplifying the signal supplied to the limiter. It is also necessary to damp the limiter output signal to the same extent that the input signal is amplified in order to restore the output signal to its original level. Thus, an amplifier and a damper are connected to the input and output terminals, respectively, of the limiting circuit to adjust the limiter level to a desired optimum level between the input signal and the output signal of the circuit comprising the amplifier, the limiter and damper, regardless of the limiter levels of the elements.

However, such an arrangement suffers from significant drawbacks. First, an amplifier is required to set an actual limiter level which differs from the limiter level of the limiter elements, thereby complicating the circuit. Second, an extra damping operation must be performed on the signal, thus causing a deterioration in the signal to noise ratio of the circuit and reducing the precision of the compression operation. In addition, when a diode limiter is connected to a compression circuit, it is generally connected between the signal channel and ground. Distortion current can flow through the limiter and affect other circuit portions through a common impedance of the grounded circuit.

When a limiter circuit is included in a recording and/or reproducing apparatus such as a tape recorder, the limiter levels must be selected between two or more magnitudes since the recording characteristics of magnetic tape vary from tape to tape. Also, the limiter level must be changed when one noise reduction circuit is changed for another. Accordingly, a switch circuit must be provided to change the limiter values of the limiter circuit.

OBJECTS AND SUMMARY OF THE INVENTION

It is an object of the present invention to provide an improved noise reduction circuit which avoids the above-mentioned disadvantages and difficulties of the prior art, and which is relatively simple in construction and inexpensive to manufacture.

It is another object of the present invention to provide a noise reduction circuit which reduces the noise in an information signal transmission system and/or in an information signal recording and reproducing apparatus.

It is yet another object of the present invention to provide a noise reduction circuit which does not require an amplifier to be connected to the input side of an amplitude limiting circuit in order to set the limiter level, and yet still enables the limiter level to be set to an optimum value, and in which unnecessary signal amplification and damping can be avoided to improve the accuracy of signal transmission and recording/reproducing performance and to prevent signal deterioration.

It is still another object of the present invention to provide a noise reduction circuit in which distorting current does not affect other circuit portions by flowing therethrough.

It is yet a further object of the present invention to provide a noise reduction circuit in which the limiter level can be selectively switched between two or more magnitudes depending upon the characteristics of a recording medium.

In accord with the present invention, a noise reduction circuit comprises combining means for generating a combined signal in response to signals supplied thereto, main channel means for supplying an information signal substantially unchanged to the combining means, and an auxiliary channel means for receiving the information signal and for supplying a modified information signal to the combining means for combining with the unchanged information signal. The auxiliary channel means includes a high pass filter means with a variable cut-off frequency for generating a filtered output signal in response to the information signal supplied thereto, a voltage-current converting means for converting the voltage level of the filtered output signal to a current and for supplying the current to the combining means, and an amplitude limiting means for limiting the amplitude of the current supplied to the combining means.

The above, and other objects, features and advantages of the present invention will apparent from the following detailed description of illustrative embodiments thereof which is to be read in connection with the accompanying drawings.

DESCRIPTION OF THE PREFERRED EMBODIMENTS

Figure 1:
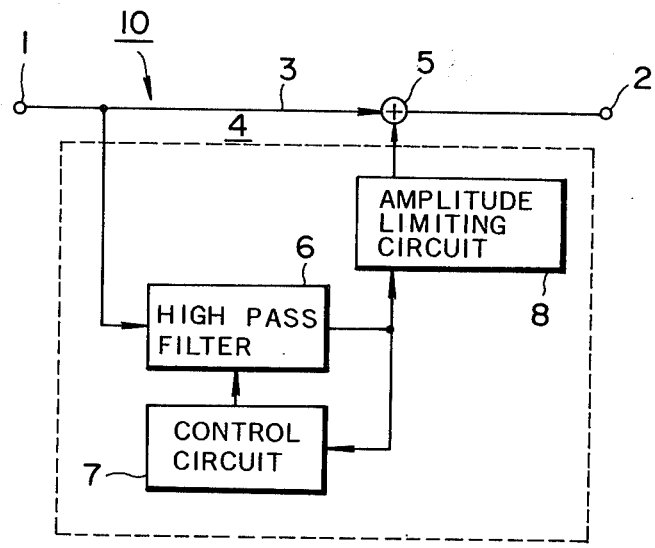
FIG. 1 is a diagram illustrating a prior art compression circuit employed in a noise reduction circuit.

FIG. 1 illustrates a typical prior art compression circuit 10 which includes a limiter or amplitude limiting circuit which prevents overshoot from an input signal which contains a sudden, large magnitude increase in amplitude. Compression circuit 10 includes a parallel connection of a main signal channel 3 and an auxiliary signal channel 4 between an input terminal 1 and an output terminal 2. The output signals from signal channels 3, 4 are summed at a summing point 5 and supplied to output terminal 2. Auxiliary signal channel 4 includes a high pass filter 6 having a variable cut-off frequency, a control circuit 7 which controls the cut-off frequency of high pass filter 6, and an amplitude limiting circuit 8.

Figure 2:
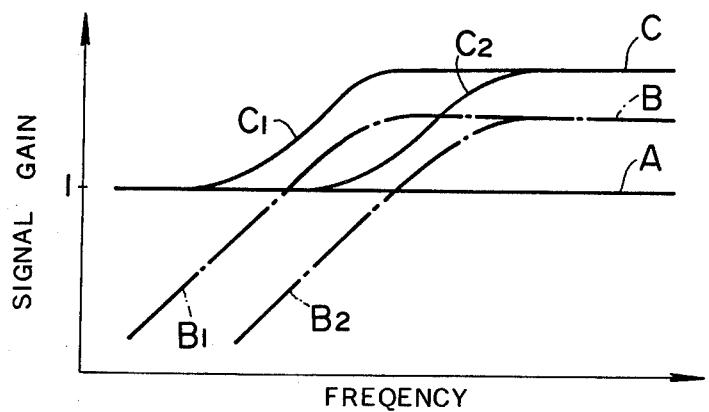
FIG. 2 is a diagram illustrating the transfer function characteristics of the circuit of FIG. 1, in which signal gain is on the vertical axis and frequency is on the horizontal axis.

FIG. 2 illustrates the frequency response of compression circuit 10. The signal transfer characteristics of main signal channel 3 are flat, with a signal gain of one, as shown by frequency characteristic curve A. The signal transfer characteristics of auxiliary signal channel 4 depend to a large extent upon the characteristics of high pass filter 6, as shown by frequency characteristic curve B, where the cut-off frequency changes in response to the signal level. The cut-off frequency is lowest for a zero signal level, as shown by curve $B_1$, while the cut-off frequency increases with an increase in the signal level, as shown by curve $B_2$. Curve C illustrates the signal transfer characteristics between input terminal 1 and output terminal 2 of compression circuit 10 obtained by combining curves A, B from signal channels 3, 4. Curves $C_1$ and $C_2$ illustrate the signal transfer characteristics corresponding to a zero signal level and an elevated signal level, respectively. As is evident, compression circuit 10 compresses the dynamic range of an input signal. An expansion circuit, not illustrated, with complementary signal transfer characteristics to those of compression circuit 10 is used for signal reception or playback to restore the original dynamic range of the input signal.

Figure 3:
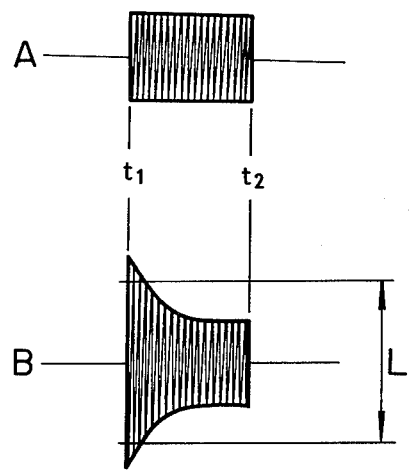
FIGS. 3A and 3B are time charts illustrating the input and output responses, respectively, of a tone burst signal supplied to the circuit of FIG. 1.

The operation of amplitude limiting circuit 8 is next to be described. As illustrated in FIG. 3A, when a tone burst signal having a duration from time $t_1$ to time $t_2$ is supplied to compression circuit 10 with amplitude limiting circuit 8 eliminated therefrom, the corresponding output signal has a large initial magnitude, or overshoot, and then decreases to the proper level, as illustrated in FIG. 3B. Since the input signal level is nearly zero before time $t_1$, high pass filter 6 has signal transfer characteristics so that the cut-off frequency is low, as indicated by curve $B_1$ in FIG. 2. Just after time $t_1$, the cut-off frequency of high pass filter 6 cannot be changed to a higher value instantly because of the finite rising time constant of control circuit 7. Accordingly, an overshoot occurs in the waveform of the output signal. The overshoot can exceed the clipping level, or the maximum allowable level, of the transmission path or recording medium. In order to prevent such overshoot, a limit level L which is smaller in magnitude than the clipping level is set by amplitude limiting circuit 8, as shown in FIG. 3B. The maximum voltage is accordingly controlled to be lower than limit level L.

It is to be appreciated that amplitude limiting circuit 8 is usually comprised of non-linear elements with PN junctions, as discussed more fully hereinbelow.

Figure 4:
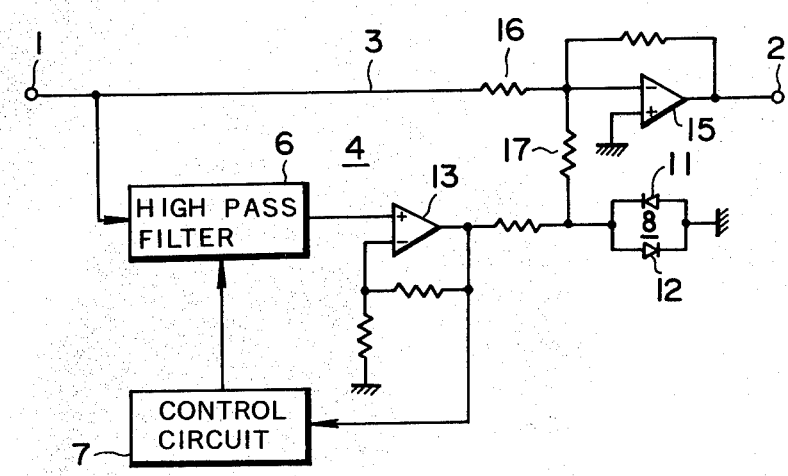
FIG. 4 is a circuit diagram illustrating in greater detail the circuit of FIG. 1.

FIG. 4 illustrates compression circuit 10 of FIG. 1 in greater detail with corresponding circuit elements indicated by the same reference numerals. Amplitude limiting circuit 8 is comprised, as depicted in the figure, of a reverse parallel circuit of PNP junctions, i.e., a parallel circuit of diodes 11, 12 with the anodes and cathodes thereof oriented in reverse order.

It is to be further appreciated that non-linear elements have limited applicability because of fixed limiter levels. For example, silicon PN junctions have a threshold value of about 0.6 V. Amplitude limiting circuit 8, formed from a reverse parallel circuit of silicon PN junctions, has a limiter level of approximately 1.2 $V_{p-p}$. This limiter level is markedly large as compared to a normal signal level in the nearby circuit portions and thus, amplitude limiting circuit 8 cannot be used unmodified in the circuit. It is therefore necessary to include an operational amplifier 13 on the input side of amplitude limiting circuit 8 to amplify an output signal from high pass filter 6 which is then supplied to limiting circuit 8 whereby the limiter level is set at an optimum level relative to the normal signal level present in the nearby circuit portions.

In the circuit of FIG. 4, summing point 5 comprises an operational amplifier 15 and summing resistors 6, 17 connected to an inverting terminal of operational amplifier 15. In the illustrated circuit, the output signal from auxiliary signal channel 4 from operational amplifier 3 is summed with the output signal from main signal channel 3 according to a mixture ratio (less than one) which is the ratio of the output signal in the auxiliary signal channel to the output signal in the main signal channel.

Operational amplifier 13 disposed in auxiliary signal channel 3 for setting the limiter level therein unduly complicates the noise reduction circuit. In addition, the unnecessary amplifying and damping of the signal level decreases the accuracy of the signal reproduction and the signal to noise ratio. Moreover, the current flowing in limiting circuit 8 can be distorted and affect other circuit elements through a common impedance inserted in the grounded circuit.

As is known, the recording characteristics of magnetic tape vary from tape to tape. Thus, when a prior art noise reduction circuit is used in a recording and reproducing device such as a tape recorder, the limiter level from the noise reduction circuit must be selectively switched between two or more values. When one noise reduction system is changed for another, the limiter level must also be changed.

Figure 5:
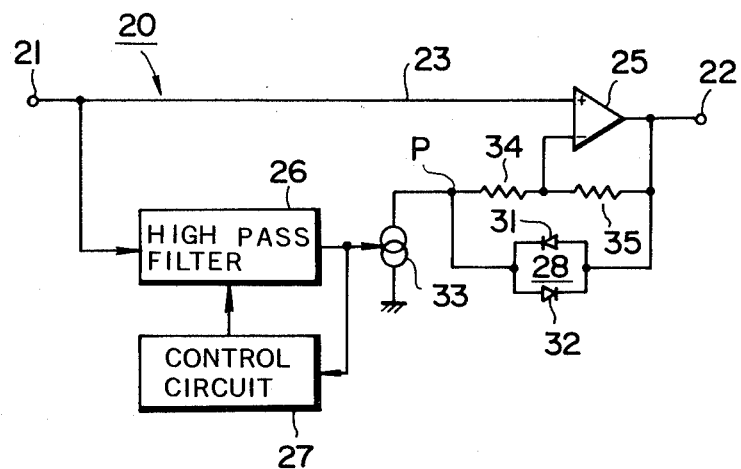
FIG. 5 is a circuit diagram of an embodiment of a compression circuit for use in a noise reduction circuit in accord with the present invention.

FIG. 5 illustrates a compression circuit 20 in a noise reduction circuit in accord with the present invention. A main signal channel 23, an auxiliary signal channel 24, and an operational amplifier 25 for summing output signals from signal channels 23, 24 are disposed between an input terminal 21 and an output terminal 22. Auxiliary signal channel 24 includes a high pass filter 26 having a variable cut-off frequency serving as a variable transfer function circuit, and a control circuit 27 for varying the cut-off frequency of high pass filter 26. The output signal from high pass filter 26 is converted by a voltage-current converter 33 into an electric current. The electric current from voltage-current converter 33 is supplied via a resistor 34 to an inverting input terminal of operational amplifier 25. A feedback resistor 35 is connected between the inverting input terminal and the output terminal of operational amplifier 25. An amplitude limiting circuit 28 is connected between the output terminal of voltage-current converter 33 and the output terminal of operational amplifier 25. Main signal channel 23 is connected to a non-inverting input terminal of operational amplifier 25.

Operational amplifier 25 acts as a voltage follower with respect to main signal channel 23 and as an inverting amplifier with respect to auxiliary signal channel 24. The output current from voltage-current converter 33 is supplied to output terminal 22 through resistors 34, 35 and operational amplifier 25. The voltage drop induced by resistor 35 contributes to the output signal supplied at output terminal 22. Thus, the mixture ratio of the signal in auxiliary signal channel 24 to the signal in main signal channel 23 can be set by selecting the conversion index coefficient of voltage-current converter 33 and the magnitude of resistor 35. The conversion index of voltage-current converter 33 is a negative value in order to sum the signal of auxiliary signal channel 24 with the signal of main signal channel 23.

Amplitude limiting circuit 28 comprises a reverse parallel circuit of PN junction elements and, in the illustrated embodiment, is two silicon diodes 31, 32 connected in parallel, with the anodes and cathodes thereof oriented in reverse order. Limiter circuit 28 has a fixed nominal limiter level of approximately 1.2 $V_{p-p}$ which is set as a function of the sum of the voltage drop values of resistors 34, 35. The virtual limiter level of the overall circuit can be freely set by suitably adjusting the value of resistor 34 regardless of the signal level at output terminal 22.

When resistors 34, 35 have resistance values $R_1$, $R_2$, respectively, the virtual or apparent limiter level is equal to $R_2/R_1+R_2$ times the nominal limiter level (for example, about 1.2 $V_{p-p}$) of amplitude limiting circuit 28. When value $R_1$ of resistor 34 is twice the value $R_2$ of resistor 35, the apparent limiter level at output terminal 22 is approximately 0.4 $V_{p-p}$. It is to be appreciated that the amplitude limiting operation does not affect the output signal in main signal channel 23.

Figure 6:
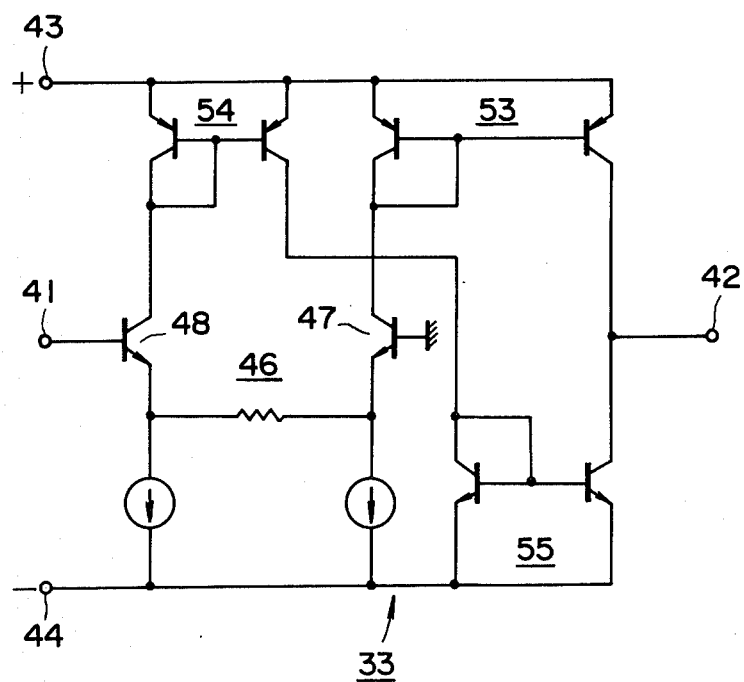
FIG. 6 is a circuit diagram illustrating a voltage to current converter used in the circuit of FIG. 5.

FIG. 6 illustrates a preferred construction of voltage-current converter 33 in which an input terminal 41 is connected to an output terminal of high pass filter 26, while an output terminal 42 is connected to a junction point P (see FIG. 5) between resistor 34 and amplitude limiting circuit 28. Terminals 43, 44 are positive and negative terminals of a power source, respectively. The voltage from high pass filter 26 is converted into an electrical current by a differential transistor circuit 46. Current mirror or current inverting circuits 53, 54 are connected to the collectors of transistors 47, 48 comprising differential transistor circuit 46. The output signal from current mirror circuit 53 is supplied to output terminal 42, while the output signal from current mirror circuit 54 is inverted in polarity by current mirror circuit 55 and supplied to output terminal 42.

The expansion circuit portion of the noise reduction circuit can be constructed separately from the compression circuit portion and is generally symmetrical or complementary to compression circuit 20. However, since only one of the recording and playback modes is selected at any one time in a recording and reproducing apparatus such as a tape recorder, a switch 29 can be provided, as shown in FIG. 7, for selecting either the compression or the expansion mode.

Figure 7:
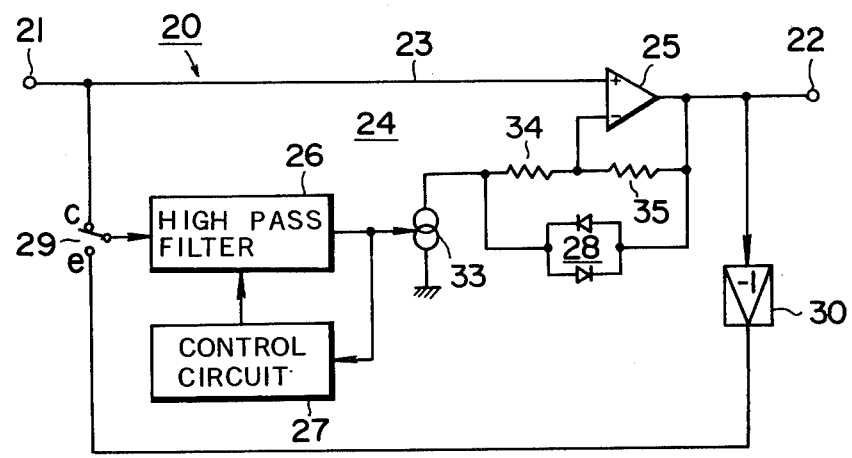
FIG. 7 is a circuit diagram illustrating the embodiment of FIG. 5 which performs both compression and expansion of an input signal.

With reference to FIG. 7, switch 29 has one terminal c connected to input terminal 21 and a second terminal e connected to an output terminal of an inverting amplifier 30 which inverts a signal supplied thereto from operational amplifier 25. It is to be appreciated that when switch 29 is changed to terminal c, a compression operation is performed on an input signal. When switch 29 is changed to terminal e, an expansion operation is performed on an input signal. The circuit elements other than switch 29 and inverting amplifier 30 are the same as those illustrated in FIG. 5 and the descriptions thereof are not repeated here for the sake of brevity.

It is to be further appreciated that a circuit in accord with the present invention eliminates an operational amplifier used only to set the limiter level. The limiter level is set to an optimum value by using only one operational amplifier 25 which sums the output signals in main signal channel 23 and auxiliary signal channel 24. The resulting circuit is simplified and such unnecessary operations of amplifying the signal level, setting a limiter level, and damping the signal level are eliminated, with a resulting improvement in the accuracy of signal transmission and recording and reproducing performance. Moreover, operational amplifier 25 acts as a voltage follower with respect to the output signal in main signal channel 23, so that the gain thereof does not depend on a resistance value of resistor 16, as in the prior art, further producing improved accuracy in signal transmission and recording and reproducing performance. In addition, distorted current does not flow through amplitude limiting circuit 8 to ground so that other circuit components cannot be affected thereby.

Figure 8:
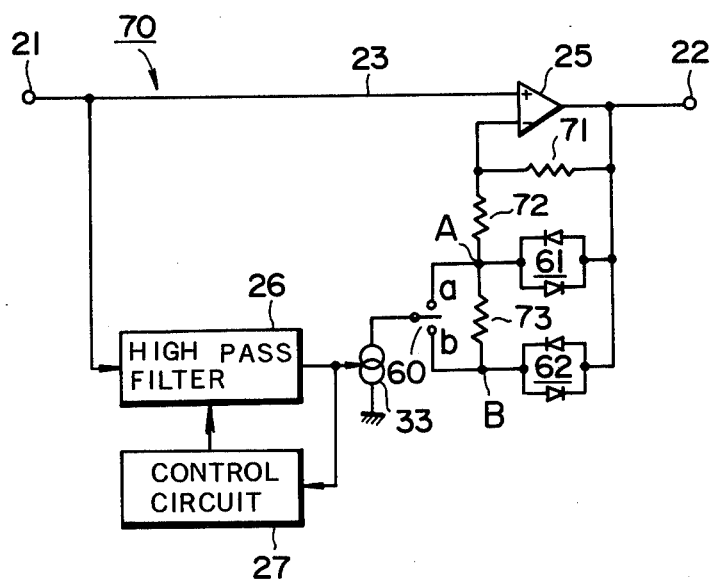
FIG. 8 is a circuit diagram illustrating an alternate embodiment of a compression circuit in accord with the present invention.

FIG. 8 illustrates a second embodiment of a noise reduction circuit 70 in accord with the present invention in which only a compression operation is performed. In the circuit of FIG. 8, circuit elements included in the embodiment of FIG. 7, such as input terminal 21, output terminal 22, main signal channel 23, auxiliary signal channel 24, operational amplifier 25, high pass filter 26, control circuit 27 and voltage-current converter 33, operate as previously described and such descriptions are not repeated here for the sake of brevity.

The embodiment of FIG. 8 includes a switch 60 connected to an output terminal of voltage-current converter 33. First and second amplitude limiting circuits 61, 62 and first, second and third resistors 71, 72, 73 are also included in circuit 70. Resistor 71 is connected between the inverting input terminal and the output terminal of operational amplifier 25 and functions as a feedback resistor. Resistor 72 is connected between the inverting input terminal of operational amplifier 25 and a node or junction A located between one terminal of amplitude limiting circuit 61 and an output terminal a of switch 60. Resistor 73 is connected to resistor 72 and to a junction or node B located between amplitude limiting circuit 62 and output terminal b of switch 60. Amplitude limiting circuits 61, 62 are further connected to the output terminal of operational amplifier 25. As discussed hereinbefore, reverse parallel circuits of PN junctions can be used as amplitude limiting circuits 61, 62, just as in the case of amplitude limiting circuit 28 of FIG. 5.

In circuit 70, the ratio of the output signal in auxiliary signal channel 24 to the output signal in main signal channel 23, known as the mixture ratio, is set by resistor 71 and does not depend on the position of switch 60. When switch 60 is connected to terminal a, so that the output signal in auxiliary signal channel 24 is supplied to junction or node A, the first apparent limiter level is determined by the sum of the voltage drop values of resistors 71, 72. The first limiter level can be easily set by selecting the resistance value of resistor 72, regardless of the mixture ratio between signal channels 23, 24. When switch 60 is connected to terminal b, and the current in auxiliary signal channel 24 is supplied to junction or node B, the second apparent limiter level is determined by the sum of the voltage drop values of resistors 71, 72, 73 and can also be set regardless of the mixture ratio and the value of the first limiter level.

If resistors 71, 72, 73 have resistance values $R_1$, $R_2$ and $R_3$, respectively, the first limiter level is $$R_1/R_1+R_2$$

times the nominal limiter level, i.e., the limiter level of amplitude limiting circuits 61, 62 (about 1.2 $V_{p-p}$). The second limiter level is $$R_1/R_1+R_2+R_3$$

times the nominal limiter level. Bwitch 60 can be used to set the limiter level to the first or the second level.

An expansion circuit for a noise reduction circuit can be included as a second circuit and can be symmetrical or complementary to circuit 70. However, in a recording and reproducing apparatus such as a tape recorder, only one of the recording and playback modes is selected at any given time. Hence, it is preferred that only one circuit be used for the compression and expansion operations and that the functions be selected by a switch. A changeover switch can be disposed in the compression and expansion circuit and connected to the input terminal of high pass filter 26 so that, upon selection of the expansion mode, the output signal from operational amplifier 25 is reversed in polarity and supplied to high pass filter 26.

Figure 9:
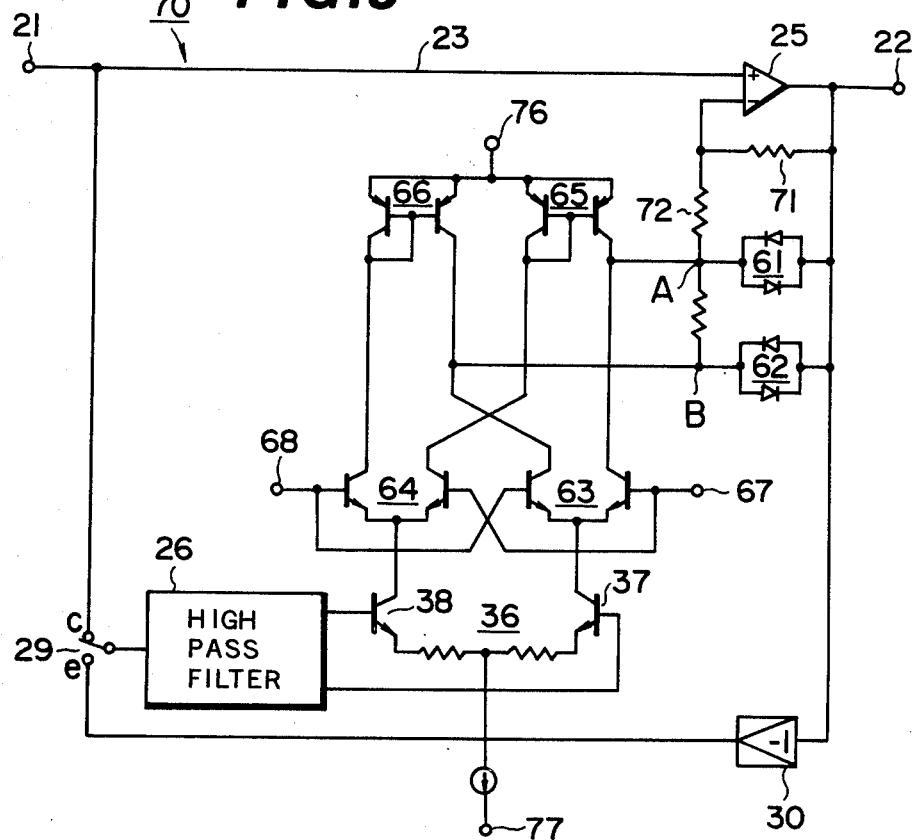
FIG. 9 is a circuit diagram illustrating the embodiment of FIG. 8 which performs both compression and expansion of an input signal.

FIG. 9 is a detailed illustration of the circuit of FIG. 8. In FIG. 9, positive and negative power source terminals 76, 77 have current supplied therethrough. Switch 29 is used to select the compression mode c or expansion mode e as described hereinbefore. Switch 29 has one terminal c connected to input terminal 21 and another terminal e connected to an output terminal of an inverting amplifier 30. Inverting amplifier 30 inverts an output signal supplied from operational amplifier 25. The output signal through switch 29 is supplied to high pass filter 26 with a variable cut-off frequency, and the output signal of high pass filter 26 is converted into an electric current by a differential transistor circuit 36 which is part of voltage-current converter 33. First and second current switches 63, 64 corresponding to switch 60 of FIG. 8 are connected to the collectors of transistors 37, 38 in differential transistor circuit 36. Current mirror or current inverting circuits 65, 66 are connected as a load relative to current switches 63, 64 and the respective output currents therefrom are supplied to junctions A, B. The output current of differential transistor circuit 36 is selectively supplied to junctions A, B by applying a high voltage to the desired one of control terminals 67, 68 of current switches 63, 64. The first and second limiter levels can thus be switched as a function of the voltage levels at terminals 67, 68. The compression and expansion mode operations can be selected by switching switch 29 to terminal c or e. It is to be appreciated that the compression and expansion modes are complementary to each other in the embodiment of FIG. 9.

Figure 10:
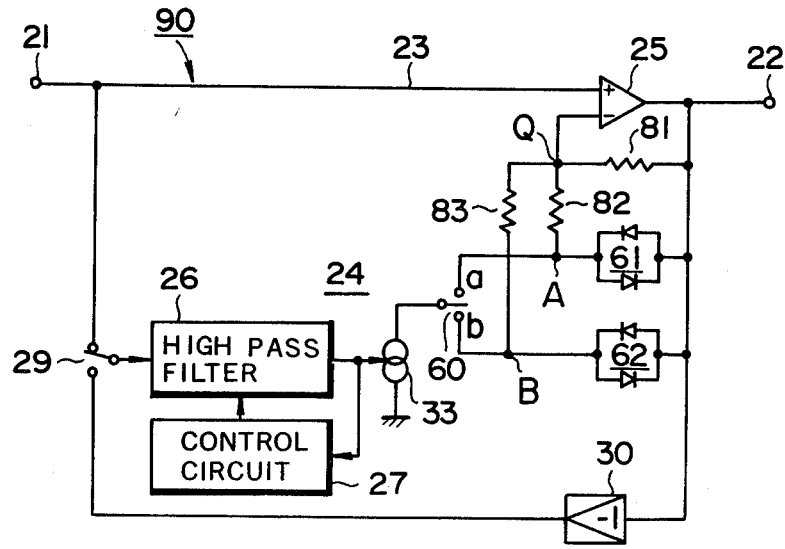
FIG. 10 is a circuit diagram of still another embodiment of a compression and expansion circuit in accord with the present invention.

FIG. 10 illustrates a third embodiment of a noise reduction circuit 90 in accord with the present invention in which descriptions of the component parts or elements previously provided for the foregoing embodiments are not repeated for the sake of brevity. Noise reduction circuit 90 of FIG. 10 includes resistors 81, 82, 83 which correspond to first, second and third resistors 71, 72, 73 in the embodiment of FIGS. 8 and 9. It is to be noted that one terminal of third resistor 83 is connected to one terminal of second resistor 82, i.e., to a junction Q between the inverting input terminal of operational amplifier 25 and first resistor 81. When switch 60 is connected to terminal a, the apparent first limiter level is $$R_2/R_1+R_2$$

times the limiter level of amplitude limiting circuit 61. When switch 60 is connected to terminal b of switch 60, the apparent second limiter level is equal to $R_1/R_1+R_3$ times the limiter level of amplitude limiting circuit 62. The first and second limiter levels can thus be set independently by setting the resistance values of R, $R_3$ for resistors 82, 83. Of course, the position of switch 60 can be used to select resistance values $R_2$, $R_3$.

As is evident from the second and third embodiments of the present invention, an operational amplifier is eliminated which would otherwise be used in the prior art to set the limiter level. The apparent limiter level is set to an optimum value by the use of an operational amplifier which sums output signals in the main and auxiliary signal channels. The circuit structure resulting therefrom is simpler than in the prior art devices, and the unnecessary operations previously performed, such as elevating the signal level, setting a limiter level, and then damping the signal level, are eliminated, with a concomitant improvement in signal transmission accuracy and recording and reproducing performance. Since the operational amplifier in accord with the present invention acts as a voltage follower with respect to the output signal in the main signal channel, the gain thereof is not dependent on the resistance ratio, further contributing to increased accuracy as compared with prior art circuits. There is no distorted current to flow to the amplitude limiting circuits and grounding circuits which could affect other circuit components. In addition, two or more limiter levels can be set and selected by a simple switch. The limiter levels of the auxiliary signal channel can be switched easily as a function of the type of noise reduction system and the type of tape used as the recording medium.

It is to be appreciated that three or more amplitude limiting circuits and four or more resistors can be used for selecting among three or more limiter values, and the invention will operate as hereinbefore described.

Although specific embodiments of the present invention have been described in detail herein with reference to the accompanying drawings, it is to be understood that the invention is not limited to those percise embodiments, and that various changes and modifications may be effected therein by one skilled in the art without departing from the spirit and scope of the invention as defined in the appended claims.

What is claimed is:

1. In a noise reduction circuit comprising combining means for generating a combined signal in response to signals supplied thereto, main channel means for supplying an information signal substantially unchanged to said combining means, and auxiliary channel means for receiving said information signal and for supplying a modified information signal to said combining means for combining with said unchanged information signal, said auxiliary channel means including:
high pass filter means with a variable cut-off frequency for generating a filtered output signal in response to said information signal supplied thereto;
voltage-current converting means for converting the voltage level of said filtered output signal to a current and for supplying said current to said combining means; and
amplitude limiting means for limiting the amplitude of said current supplied to said combining means.

2. The circuit of claim 1; wherein said amplitude limiting means acts on said current to limit the amplitude thereof.

3. The circuit of claim 1; wherein said combining means is an amplifier means with inverting and non-inverting input terminals, and wherein said main channel means supplies said information signal to said non-inverting input terminal and said auxiliary channel means supplies said modified information signal to said inverting input terminal.

4. The circuit of claim 1; wherein said auxiliary channel means includes resistor means disposed between said voltage-current converting means and said combining means.

5. The circuit of claim 4, in which said combining means has an output terminal; and further comprising feedback resistor means connected to said output terminal and said resistor means.

6. The circuit of claim 5; wherein said auxiliary channel means includes control means for controlling said cut-off frequency of said high pass filter means.

7. The circuit of claim 5; and further comprising:
inverting means connected to said output terminal of said combining means for generating an inverted signal in response to said combined signal supplied thereto; and
switch means for alternately supplying said information signal and said inverted signal to said high pass filter means.

8. The circuit of claim 5; wherein said amplitude limiting means is a pair of PN junction elements reversely connected in parallel.

9. The circuit of claim 5; wherein said amplitude limiting means comprises first and second amplitude limiting means connected to said output terminal of said combining means for limiting said amplitude of said current, and further comprising switch means for alternately connecting said first amplitude limiting means and said second amplitude limiting means to said voltage-current converting means.

10. The circuit of claim 9; and further comprising:
inverting means for supplying an inverted signal in response to said combined signal supplied thereto; and
switch means for alternately supplying said information signal and said inverted signal to said high pass filter means.

11. The circuit of claim 9; wherein said auxiliary channel means includes second resistor means for connection in series with the first-mentioned resistor means when said switch means connects said voltage-current converting means to said second amplitude limiting means.

12. The circuit of claim 9; wherein said auxiliary channel means includes second resistor means for connection in series with said voltage-current converting means and said combining means when said switch means connects said second amplitude limiting means to said voltage-current converting means.

13. The circuit of claim 9; wherein said first amplitude limiting means and said second amplitude limiting means each comprises a pair of PN junction elements reversely connected in parallel.

14. The circuit of claim 9; wherein said first amplitude limiting means and said second amplitude limiting means each comprises first and second diode means reversely connected in parallel.

15. A noise reduction circuit comprising:

amplifier means having inverting and non-inverting input terminals and an output terminal;

main channel means for supplying an information signal substantially unchanged to said non-inverting input terminal of said amplifier means;

auxiliary channel means for supplying a signal to said inverting terminal of said amplifier means and including:

transfer function means receiving said information signal for generating an output signal with the frequency thereof limited;

converting means for converting the voltage level of said output signal from said transfer function means to current and supplying said current to said inverting terminal of said amplifier means;

limiting means connected between said output terminal of said amplifier means and said converting means for limiting the amplitude of said current supplied thereto;

resistor means connected between said converting means and said inverting terminal of said amplifier means; and feedback resistor means connected between said output terminal and said inverting terminal of said amplifier means.

16. The circuit of claim 15; and further comprising control means for generating control signals for said transfer function means to vary said frequency limited thereby.

17. The circuit of claim 15; and further comprising:

inverting amplifier means connected to said output terminal of said amplifier means for generating an inverted signal in response to a signal supplied thereto; and switch means for alternately supplying said inverted signal and said information signal to said transfer function means.

18. The circuit of claim 15; wherein said limiting means comprises first and second limiting means for limiting the amplitude of a signal supplied thereto and connected to said output terminal of said amplifier means, and further comprising switch means for alternately connecting said first limiting means and said second limiting means to said converting means.

19. The circuit of claim 18; and further comprising second resistor means connected in series with said first-mentioned resistor means and also connected to said second limiting means.

20. The circuit of claim 18; and further comprising second resistor means connected to said inverting terminal of said amplifier means and to said second limiting means.

* * * * *